(12) United States Patent
El Sabbagh et al.

(10) Patent No.: US 11,457,524 B2
(45) Date of Patent: Sep. 27, 2022

(54) INTEGRATED FILTER FOR DE-SENSE REDUCTION

(71) Applicant: NXP B.V., Eindhoven (NL)

(72) Inventors: Mahmoud Mohamed Amin El Sabbagh, San Jose, CA (US); Anu Mathew, Chandler, AZ (US); Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 679 days.

(21) Appl. No.: 16/397,709

(22) Filed: Apr. 29, 2019

(65) Prior Publication Data
US 2020/0344872 A1 Oct. 29, 2020

(51) Int. Cl.
*H05K 1/02* (2006.01)

(52) U.S. Cl.
CPC ......... *H05K 1/0216* (2013.01); *H05K 1/0259* (2013.01)

(58) Field of Classification Search
CPC ...... H04B 1/10; H04B 1/1027; H04B 1/1036; H04B 1/109; H04B 1/123; H04B 3/54; H04B 3/52; H04B 3/56; H04B 2203/5425; H04B 15/02; H04B 2203/5483; H04B 10/1143; H04B 15/04; H04B 1/3888; H04B 5/00; H04B 5/02; H05K 1/0216; H05K 1/0259; H05K 1/0219; H05K 1/0233; H05K 2201/09609; H05K 1/141; H05K 1/181; H05K 9/00; H05K 1/18; H05K 2201/0367; H05K 1/0221; H05K 2201/058; H05K 2201/093; H05K 2201/09354; H05K 2201/10106; H05K 2201/2009; H05K 2201/0379; H05K 2201/097; H05K 1/0257; H05K 9/0067; H05K 1/0298; H05K 2201/09663; H05K 1/115; H05K 1/0243; H05K 2201/10098; H05K 2201/09763; G06F 13/4068; H01P 1/20;
(Continued)

(56) References Cited

U.S. PATENT DOCUMENTS 5,294,897 A * 3/1994 Notani .................... H01L 24/49
29/841
5,912,597 A * 6/1999 Inagawa ............... H05K 1/0216
174/265
(Continued)

FOREIGN PATENT DOCUMENTS

EP 3125069 A1 * 2/2017 ........... H05K 9/0039
TW 201944664 11/2019
(Continued)

*Primary Examiner* — Lana N Le

(57) ABSTRACT

A chip includes a plurality of ground conductors that at least partially surround a signal conductor on a same die. The signal conductor carries an interface (e.g., high speed) signal, and the ground conductors filter electromagnetic interference generated by the signal carried by the signal conductor. A chip package includes a plurality of ground pins around a signal pin that carries an interface signal. The ground pins filter electromagnetic interference generated by the signal carried by the signal pin. A printed circuit board includes a plurality of ground conductors around a signal line. The ground conductors are in vias and filter electromagnetic interference generated by an interface signal carried by the signal line.

11 Claims, 15 Drawing Sheets

(58) Field of Classification Search
CPC .... H01P 1/20345; H01P 1/203; H01P 1/2135; H01P 1/14; H01L 2924/3025; H01L 23/552; H01L 23/50
USPC ...... 455/296, 63.1, 501, 114.2, 278.1, 226.3, 455/213, 283, 117, 128, 286, 306, 307, 455/339, 550.1, 67.13, 67.11, 570, 135, 455/277.2, 310
See application file for complete search history.

(56) References Cited

U.S. PATENT DOCUMENTS

| | | | | |
|---|---|---|---|---|
| 5,970,138 | A * | 10/1999 | Suda | H04B 15/02 333/22 R |
| 6,097,581 | A * | 8/2000 | Anthony | H04B 1/123 455/337 |
| 7,539,025 | B2 * | 5/2009 | Park | H05K 1/148 361/792 |
| 7,615,856 | B2 * | 11/2009 | Sakai | H04B 1/02 257/686 |
| 8,781,412 | B2 * | 7/2014 | Mihota | H04B 7/0413 455/101 |
| 8,797,763 | B2 * | 8/2014 | Fukunaga | H05K 9/0067 361/799 |
| 9,369,165 | B1 | 6/2016 | Gaikwad et al. | |
| 9,634,774 | B1 | 4/2017 | Mohammad Sayem et al. | |
| 9,780,755 | B1 | 10/2017 | Omid-Zohoor et al. | |
| 9,799,947 | B1 | 10/2017 | Lim et al. | |
| 10,236,938 | B2 | 3/2019 | McCormack et al. | |
| 11,147,977 | B2 * | 10/2021 | Stevenson | H03H 1/00 |
| 2005/0207132 | A1 * | 9/2005 | Kwak | H05K 1/0233 361/760 |
| 2007/0188997 | A1 * | 8/2007 | Hockanson | G06F 1/182 361/760 |
| 2009/0207538 | A1 | 8/2009 | Crawley et al. | |
| 2012/0149306 | A1 * | 6/2012 | Gebara | H04B 1/123 455/63.1 |
| 2014/0045546 | A1 * | 2/2014 | Onodera | H05K 1/0227 455/550.1 |
| 2014/0185249 | A1 | 7/2014 | Chien | |
| 2016/0021735 | A1 | 1/2016 | Lee | |
| 2017/0099728 | A1 * | 4/2017 | Janssen | H04B 3/30 |
| 2017/0194687 | A1 * | 7/2017 | Taniguchi | H01P 3/081 |
| 2017/0250666 | A1 * | 8/2017 | Whitefield | H04B 1/02 |
| 2018/0242444 | A1 * | 8/2018 | Toda | H05K 1/0216 |
| 2019/0094649 | A1 * | 3/2019 | Kono | G02F 1/2257 |
| 2020/0344875 | A1 * | 10/2020 | Sugahara | H05K 1/0243 |
| 2021/0399925 | A1 * | 12/2021 | Lee | G06F 13/4068 |

FOREIGN PATENT DOCUMENTS

| | | | | |
|---|---|---|---|---|
| WO | WO-9937008 A1 * | 7/1999 | ............ | H01G 4/35 |
| WO | WO-2018115163 A1 * | 6/2018 | .......... | H05K 1/0259 |
| WO | WO-2018/227324 | 12/2018 | | |

* cited by examiner

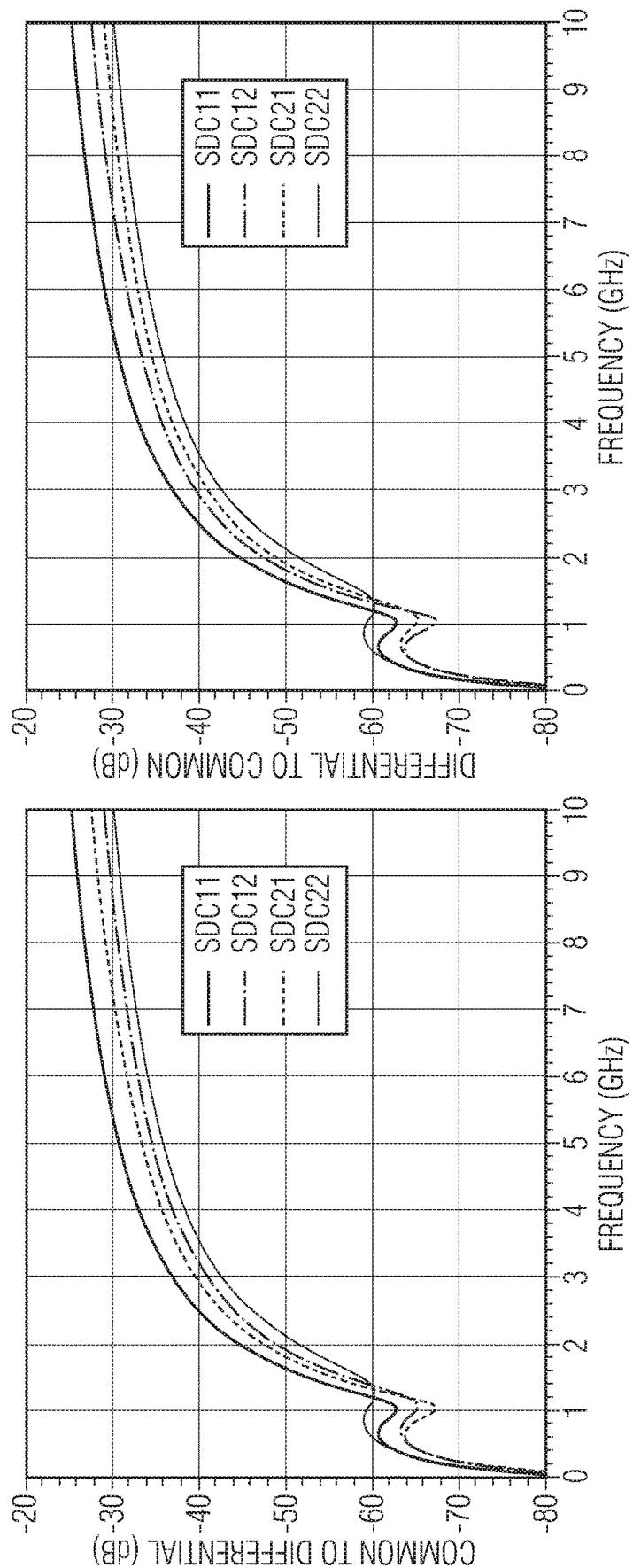

INTEGRATED FILTER FOR DE-SENSE REDUCTION

TECHNICAL FIELD

Example embodiments disclosed herein relate to filtering signals in an electronic circuit.

BACKGROUND

Smart phones, tablets, and other mobile devices experience performance degradation for a variety of reasons. One reason is de-sense, e.g., the degradation in sensitivity that takes place in a mobile device as a result of electronic noise. The noise may come from many sources, including signals traveling through the lines of an interface such as a Universal Serial Bus (USB) cable. These signals may generate harmonics that interfere with (and thus degrade) receiver sensitivity and/or the signal quality of an antenna.

In one case, the degradation in receiver sensitivity may occur from harmonics and/or other forms of noise adversely affecting a differential signal path. In another case, impedance mismatch may occur that generates noise. In either case, the noise is coupled to or picked up by the antenna of the mobile device. This problem is exacerbated the closer the antenna is to a semiconductor device (sometimes referred to as a "chip") generating or carrying the signals. All of these effects may ultimately distort the linearity of the receiver and/or reduce spurious-free dynamic range (SFDR), which, in turn, produces de-sense that reduces sensitivity.

Various attempts have been made to reduce de-sense in a mobile device. One attempt involves adding an external chip to a cable connected between the USB port of the mobile device and the USB port of a connected peripheral device. However, such a chip may generate noise that makes the de-sense problem worse. Another attempt involves adding an external electromagnetic interference (EMI) filter to the chip or the device to reduce de-sense in an operating band of interest. However, such a filter increases costs, design complexity, and consumes space.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, a chip includes at least one signal conductor and a filter including a plurality of ground conductors. The at least one signal conductor is configured to carry a signal that conforms to an interface protocol, and the plurality of ground conductors at least partially surround the at least one signal conductor on a same die. The plurality of ground conductors configured to filter electromagnetic interference generated by the signal to be carried by the at least one signal conductor. The electromagnetic interference may include harmonics generated by the signal to be carried by the at least one signal conductor.

The at least one signal conductor may include a first signal conductor and a second signal conductor and wherein the first and second signal conductors correspond to a differential signal line of the interface protocol. The ground conductors may be arranged in a symmetrical pattern that reduces mixed mode conversion. The chip may be electrically connected between (a) one or more signal lines of an interface and (b) a plug or connector of the interface. The interface may be a cable, and the interface protocol may be a Universal Serial Bus (USB) protocol.

In accordance with one or more other embodiments, a chip package includes at least one signal pin and a filter including a plurality of ground pins. The at least one signal pin is configured to carry a signal that conforms to an interface protocol, and the plurality of ground pins at least partially surround the at least one signal pin to filter electromagnetic interference generated by the signal to be carried by the at least one signal pin. The electromagnetic interference may include harmonics generated by the signal to be carried by the at least one signal pin.

The at least one signal pin may include a first signal pin and a second signal pin and wherein the first and second signal pins correspond to a differential signal line of the interface protocol. The ground pins may be arranged in a symmetrical pattern that reduces mixed mode conversion. The chip package may be electrically connected between (a) one or more signal lines of an interface and (b) a plug or connector of the interface. The interface may be a cable, and the interface protocol may be a Universal Serial Bus (USB) protocol. The chip package may include an electrostatic discharge circuit electrically connected to one or more of the ground pins. The electrostatic discharge circuit may include a plurality of diodes arranged in a symmetric pattern relative to the at least one signal pin.

In accordance with one or more other embodiments, a printed circuit board includes a plurality of vias, at least one signal line, and a plurality of ground conductors. The plurality of ground conductors are in respective ones of the vias and at least partially surround the at least one signal line, which is configured to carry a signal that conforms to an interface protocol. The plurality of ground conductors are configured to filter electromagnetic interference generated by the signal to be carried by the at least one signal line. The ground conductors may be arranged symmetrically relative to the at least one signal line.

The printed circuit board may include an electrostatic discharge circuit electrically connected to one or more of the ground conductors. The electrostatic discharge circuit may include a plurality of diodes arranged in a symmetric pattern relative to the at least one signal line. The at least one signal line may include a first signal line and a second signal line and wherein the first and second signal lines correspond to a differential signal line. The printed circuit board may include a first conductive line and a second conductive line adjacent to the first conductive line, where the first conductive line electrically connects a first diode to a first ground conductor of the plurality of ground conductors and the second conductive line electrically connects a second diode the first ground conductor or a second ground conductor of the plurality of ground conductors. The first and second conductive lines and the first and second diodes may be arranged in a symmetrical pattern between the first signal line and the second signal line.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

FIGS. 10C and 10D illustrate results without the embodiments in FIGS. 10A and 10B.

DETAILED DESCRIPTION

Figure 1:
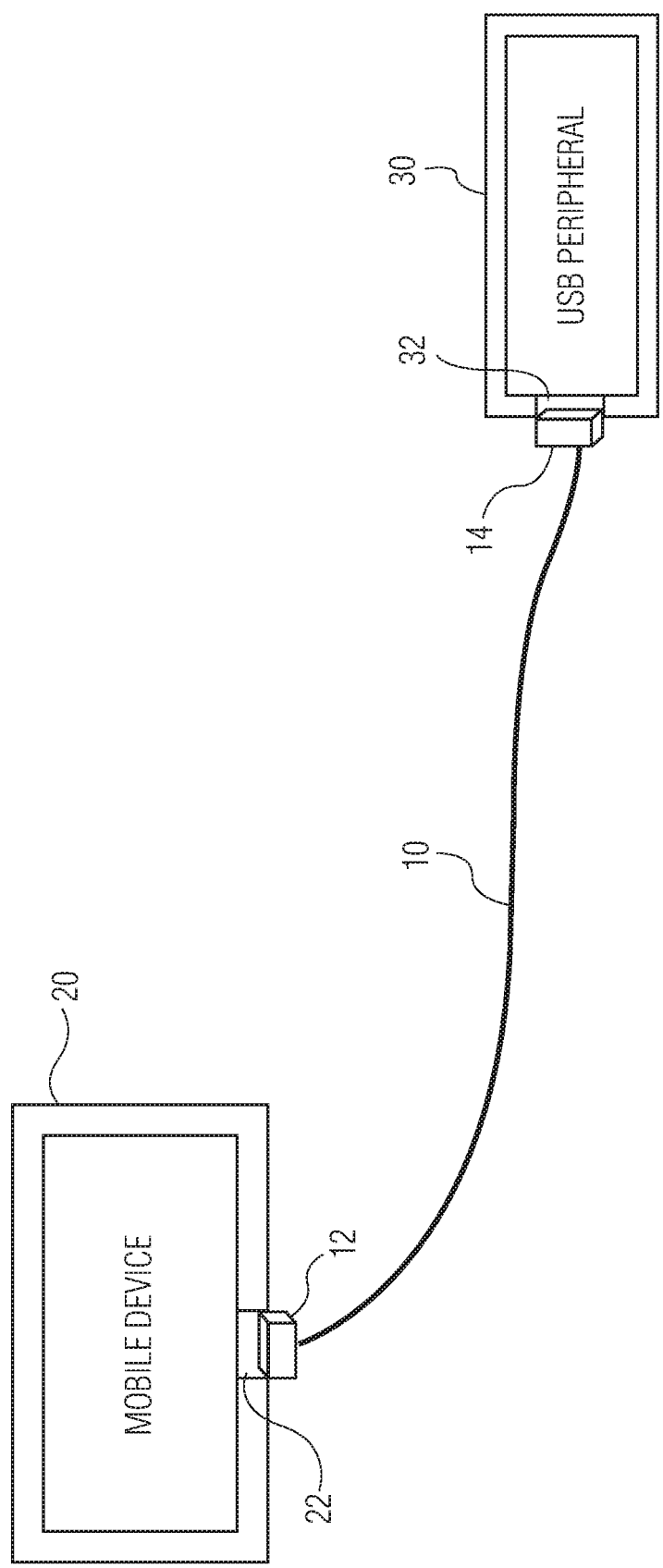
FIG. 1 illustrates an embodiment of an interface connecting two devices.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Example embodiments describe a filter that reduces de-sense in a mobile device or other electronic system that is adversely affected by noise, and particularly radio frequency (RF) noise. The filter may be integrated into a chip, chip package, and/or printed circuit board having an interface, and which chip, chip package, and/or printed circuit board coupled to (e.g., a part of, or external to) the mobile device. In some implementations, the chip, chip package, and/or printed circuit board may process or route signals between the device and the signal lines of a cable. In this case, the filter may be located, for example, in a plug of the cable connecting the mobile device to another (e.g., peripheral) device. In one embodiment, the chip, chip package, and/or printed circuit board may be included in a communications port of the mobile device or connected device.

Integrating the filter directly into the chip, chip package, or printed circuit board may reduce de-sense or other noise-related effects that may adversely affect performance of the mobile device. The integrated filter may also prevent an increase in costs that are incurred by other approaches and may also be implemented without consuming extra chip space or the use of external components. In one embodiment, the ground conductors of the filter may be used to perform electrostatic discharge (ESD) protection and/or a switching function that reduces corrosion.

FIG. 1 illustrates an embodiment of an interface 10 used to connect an electronic device 20 to another (e.g., peripheral) device 30. The interface 10 may be a cable, connector, or other communications path that includes one or more conductors for carrying signals, e.g., power, data, control, etc. For illustrative purposes, the interface will be discussed as a cable 10 which includes a first connector 12 and a second connector 14. The first connector 12 is coupled to (e.g., plugged into) a receptacle or port 22 of the electronic device 20 and may include a chip, chip package, and/or printed circuit board in accordance with embodiments described herein. The chip may process and/or route signals between the signal lines in the cable and the electronic device 20. The second connector 14 is coupled to (e.g., plugged into) a receptacle or port 32 of the peripheral device 30. Examples of the cable include a USB (e.g., USB Type-C), FireWire, Thunderbolt, Display Port, PCIe, Lightning, and HDMI cable.

The interface 10 includes a plurality of ground conductors that are distributed in a predetermined pattern around or adjacent to one or more signal conductors on the chip (e.g., die), chip package, and/or printed circuit board. The ground conductors may form a filter for electromagnetic interference (EMI) generated by signals carried by the one or more signal conductors. The conductors may be pins, signal lines, pads, traces, or other conductors for carrying signals.

In one embodiment, the filter is included in the chip to shield the mobile device 10 from EMI generated by USB signals carried by a signal conductor. In this case, the ground conductors may at least partially surround the one or more signal conductors on a same die of the chip. In one embodiment, the filter is included in the chip package to shield the mobile device 10 from EMI generated by USB signals carried by at least one signal pin. In this case, a plurality of ground pins may at least partially surround the at least one signal pin to filter EMI generated by the USB signals carried by the at least one signal pin. In one embodiment, the filter is included on a printed circuit board to which the chip and chip package are mounted. In this case, a plurality of ground conductors surround at least one signal line carrying USB signals. The ground conductors may be located in vias that enable connection of ground planes in the printed circuit board in order to filter EMI generated by the USB signals carried by the at least one signal line. In another embodiments, the filter (or portions thereof) may be included on all or a portion of the chip, chip package, and printed circuit board to form an RF shield for reducing EMI.

Such a filter may also be implemented to have a symmetrical arrangement of features that reduce the possibility of mixed-mode conversions from occurring, for example, as a result of connecting the chip (e.g., tapping or inline) to the cable 10. In one or more embodiments, conductive lines and/or traces on the chip, package, and/or printed circuit board may be arranged in a symmetrical pattern along with electrostatic discharge features.

Through the self-integrated filtering operation performed by the ground conductors, performance of the mobile device 10 may be improved through a reduction in de-sense. The ground conductors may also perform electrostatic discharge (ESD) protection and/or a switching function that reduces corrosion. Also, one or more embodiments may be implemented in a manner that does not increase costs, consume extra chip space, or require external components.

The electronic device 20 may be any type of device that can be coupled to the cable 10, for example, for purposes of interacting with the electronic device 10. In one embodiment, the electronic device 20 may include an application processor which communicates with the peripheral device 30 through the chip, chip package, and/or printed circuit board in the first connector 12. Examples of the electronic device 20 include a peripheral device, a smartphone, tablet, personal digital assistant, notebook or laptop computer, camera, navigation device, display, television, monitor, or another type of electronic device. For illustrative purposes, the electronic device will be discussed as a mobile device.

The peripheral device 30 may be a notebook or laptop or desktop computer, charger, docking station, keyboard, speaker, adapter, portable hard drive, printer, scanner, or any other type of device designed to connect to and operate with an electronic device, for example, as described above.

Figure 2:
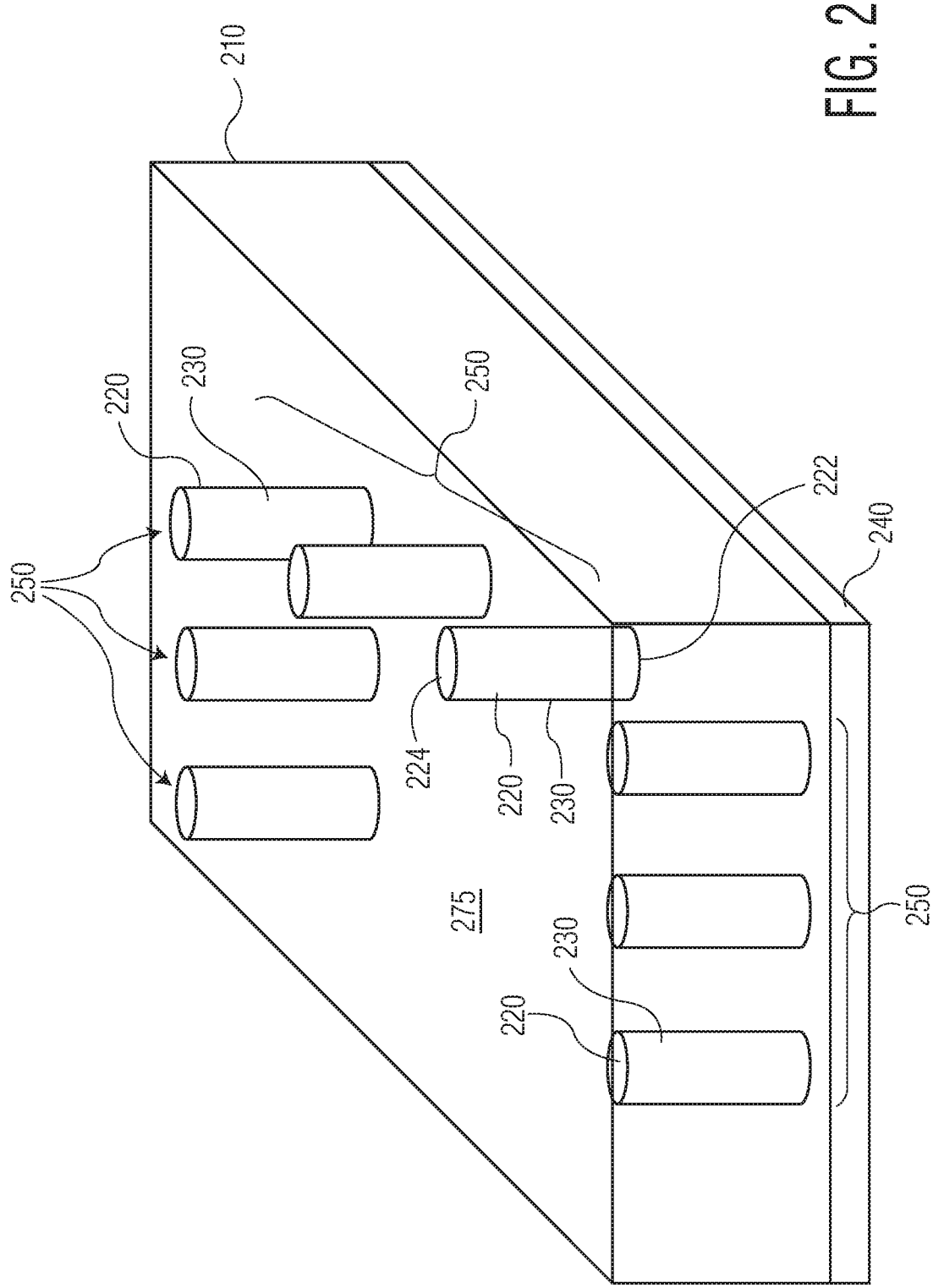
FIG. 2 illustrates an embodiment of a printed circuit board which includes a filter.

FIG. 2 illustrates an embodiment of a printed circuit board 210 which, for example, may be in the first connector 12 of the cable 10. In one embodiment, the printed circuit board 210 is electrically coupled to the chip for processing and or routing the signals between the mobile device 20 and the signal lines of the cable 10. The printed circuit board and chip may be included in a chip package coupled between a plug of the first connector 12 and the signal lines of the cable.

Referring to FIG. 2, the printed circuit board 210 includes a filter 250 formed from a plurality of ground pins 220 arranged in a predetermined pattern. The ground pins 220 are located in a respective plurality of vias 230 in the printed circuit board. Each ground pin 220 may include a first end 222 coupled to a common and/or all ground layers 240 and an opposing second end 224 coupled to the chip. The ground pins 220 may be arranged in a predetermined pattern. For example, the ground pins 220 may at least partially surround (or otherwise be adjacent to) one or more signal conductors of the chip (e.g., located in area 275) to form a ring- or bracket-shaped RF shield for filtering out EMI generated by the one or more signal conductors. In one embodiment, the ground pins 220 may be symmetrically arranged relative to the signal conductors of the chip in order to provide electrostatic discharge protection and to filter harmonics (e.g., third- and fourth-order harmonics) and other forms of RF noise generated by signals passing through the signal conductors. This symmetric arrangement may reduce de-sense in the electronic device 20, while at the same time reduce or minimize mixed mode conversion and adverse effects caused by ESD. This symmetric arrangement may also reduce the amount of losses across the signal path and may reduce harmful reflections due to insertion of the chip in the signal path.

Figure 3:
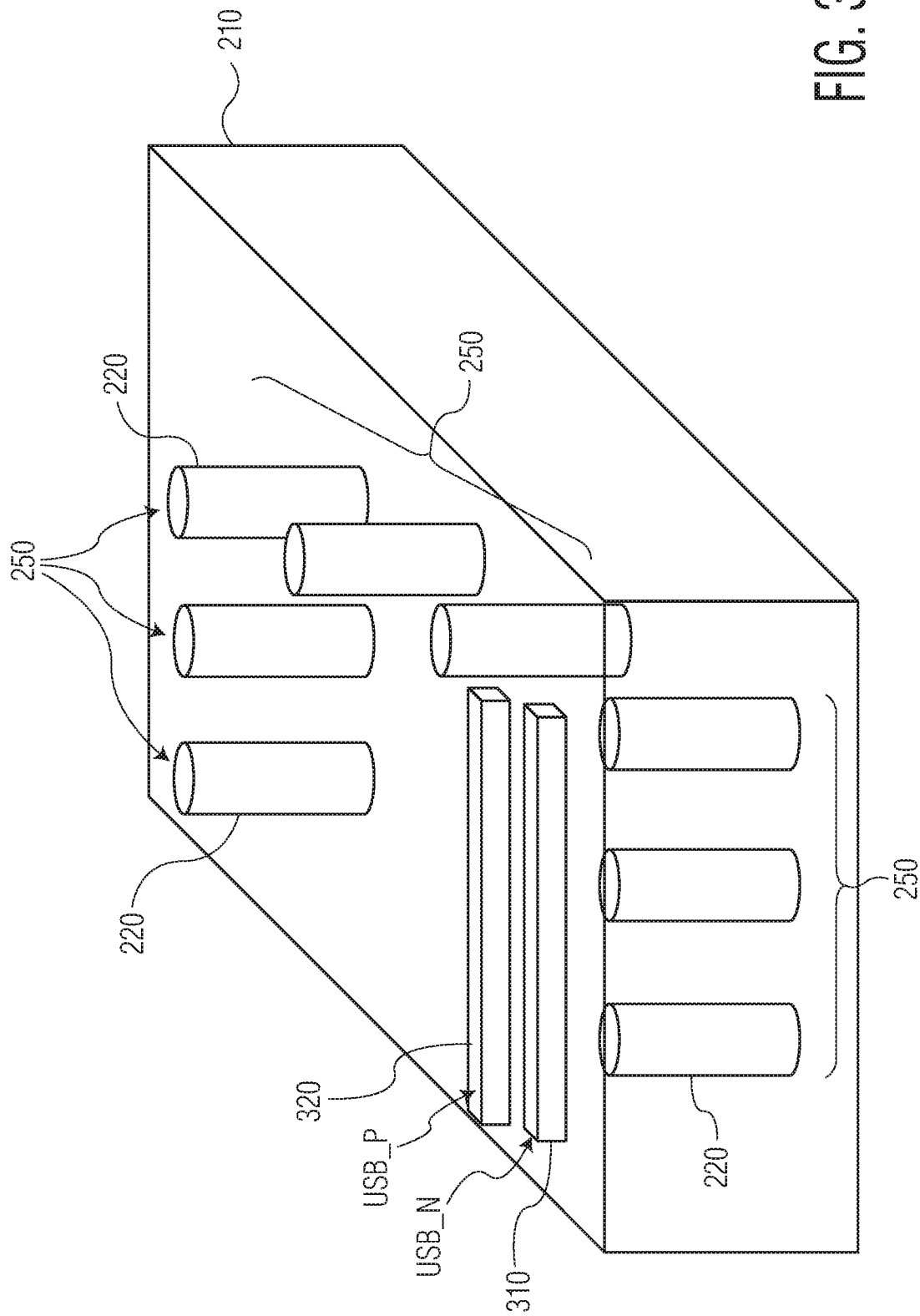
FIG. 3 illustrates the printed circuit board including a differential signal line.

FIG. 3 illustrates a pair of signal conductors 310 and 320 on the printed circuit board 210 of FIG. 2. The signal conductors may be signal lines or conductive traces within or on a surface of the printed circuit board. In this example, the signal conductors 310 and 320 form a differential signal line that carries one or more USB high-speed signals (e.g., USB2.0, USB3.1 Gen1, USB3.1 Gen2, etc.) received from or transmitted through the cable 10. For illustrative purposes, the signal conductors are labeled USB_N and USB_P indicating a differential signal line, where N stands for negative and P stands for positive. The signal conductors 310 and 320 may be coupled to the pinouts of the chip package (e.g., by bumps, etc.) to be mounted on the printed circuit board. The ground conductors 220 in the printed circuit board filter EMI generated when the USB signals pass through the signal lines. In one embodiment, the ground conductors 220 are symmetrically arranged (e.g., in this case a U-shape or partial ring) relative to the signal lines.

Figure 4:
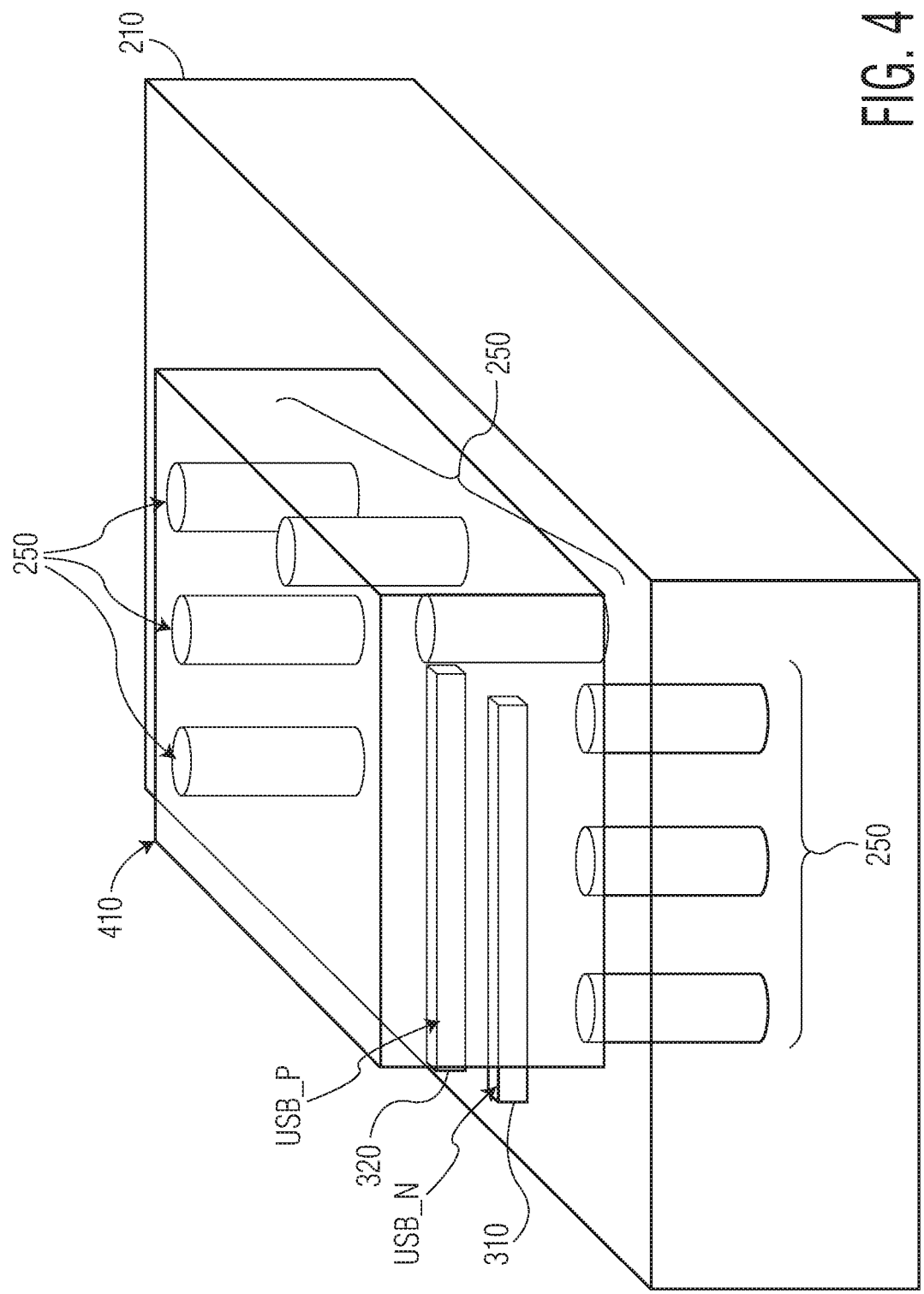
FIG. 4 illustrates a chip and chip package mounted on the printed circuit board.

FIG. 4 illustrates a chip located within a chip package (collectively labeled 410) mounted on the printed circuit board 210. The chip package includes pinout terminals (generally "pinouts") respectively connected to the USB signal lines (e.g., 310 and 320) and ground conductors 220 on the printed circuit board. While only two signal lines USB_N and USB_P are illustrated, it is understood that the printed circuit board 210 may include conductive lines for all of the pinouts of the chip package 410, in order to allow for an exchange of signals between the mobile device 20 and the peripheral device 30 through cable 10. The chip of the chip package 410 may include conductors (e.g., bumps, pinouts, contacts, etc.) electrically connected to respective ones of the pinouts of the chip package.

Figure 5:
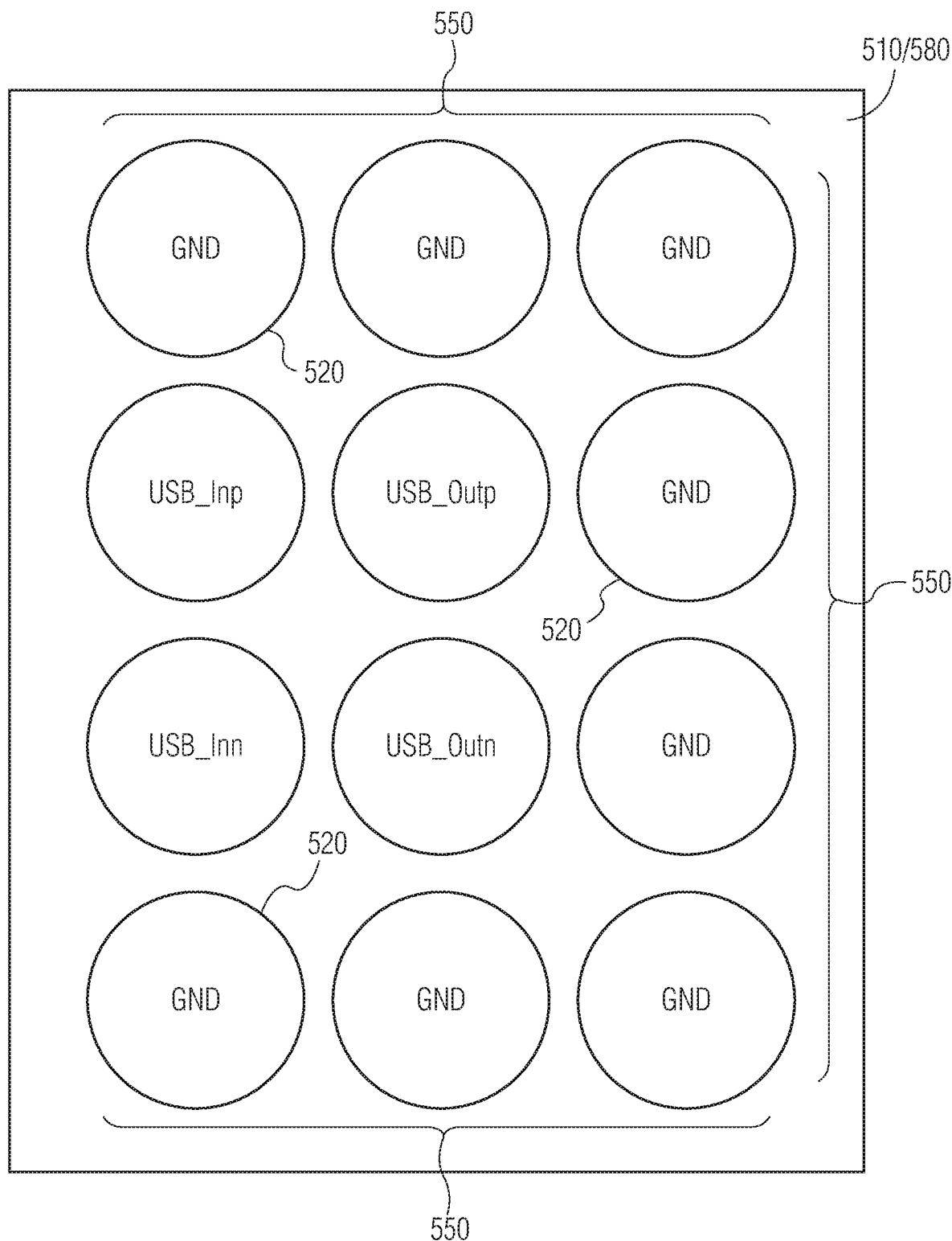
FIG. 5 illustrates an embodiment of a chip and chip package including a filter.

FIG. 5 illustrates an embodiment of a chip 510 which may include a filter 550 that includes a plurality of ground conductors (GND) 520 and two USB differential signal lines. The first differential signal line includes a first signal line USB_Inp and a second signal line USB_Outp. The second differential signal line includes a first signal line USB_Inn and a second signal line USB_Outn. In this embodiment, the ground conductors 520 are arranged in a symmetrical pattern surrounding both of the USB differential signal lines (in one embodiment, additional ground conductors could be provided so that the USB differential signal lines are fully surrounded). The ground conductors 520, therefore, form an RF shield around the signal lines to filter out harmonics, noise, and/or other forms of EMI that may contribute to the de-sense of the mobile device 20.

The embodiment of FIG. 5 may also be used to represent a chip package 580, where GND 520 corresponds to ground pins (or pinouts), USB_Inp and USB_Outp correspond to signal pins (or pinouts) for the first differential signal line, and USB_Inn and USB_Outn correspond to signal pins (or pinouts) for the second differential signal line. As illustrated in FIG. 5, the ground pins 520 are at least partially arranged in a ring or bracket (e.g., C-shaped) pattern around the USB signal pinouts of the chip package.

Figure 6:
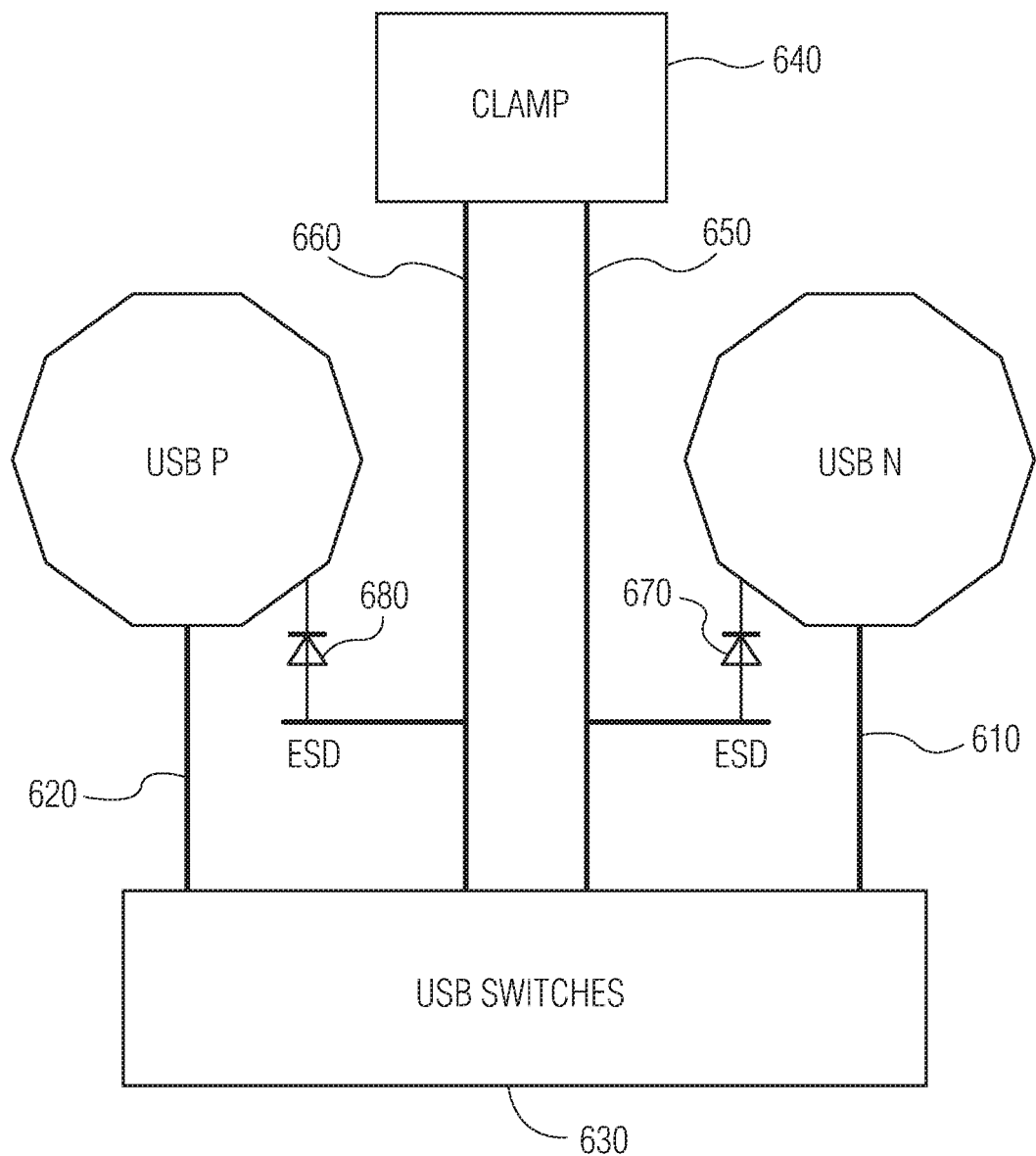
FIG. 6 illustrates an embodiment including a symmetrical arrangement of features that reduce de-sense and perform electrostatic discharge protection.

FIG. 6 illustrates a differential pair of signal lines 610 and 620, which, for example, may correspond to the USB input line or output line. In one embodiment, signal lines 610 and 620 are high-speed lines that are connected to respective pinouts, e.g., pinouts USB_Inn and USB_Inp as illustrated in FIG. 5. At least portions of the signal lines 610 and 620 may be connected to the conductive traces USB_N and USB_P on the printed circuit board 210 illustrated in FIG. 3. The pinouts and differential signals lines are electrically connected to USB switches 630 in the mobile device 20 illustrated in FIG. 1. A clamp circuit 640 is coupled to the USB switches 630 through signal lines 650 and 660. Each of the signal lines 650 and 660 is coupled to a respective one of the pinouts through a diode circuit 670/680 to provide electrostatic discharge protection (ESD).

In many designs, EMI emissions and mixed-mode conversions occur as a result of various factors including asymmetry. In accordance with one or more embodiments, a symmetrical design is presented which reduces or eliminates EMI emissions and mixed-mode conversions. This symmetrical design includes placing ESD diode circuits 670 and 680 and their associated conductive signal paths, and all associated layout including shield ring, ground network, and biasing power network, in a symmetrical pattern relative to the USB pinouts and signal lines. The size(s) and type(s) of diodes may be selected to produce a predetermined level of ESD performance, while reducing or minimizing de-sensing in USB communications at the same time. In one embodiment, ESD diodes may be used with junction capacitances that are pre-biased at a (higher) voltage that minimizes equivalent junction capacitances at each pin, thereby improving return loss. This enhancement may benefit overall signal integrity performance of the USB signaling including de-sensing reduction or minimization.

Figure 7:
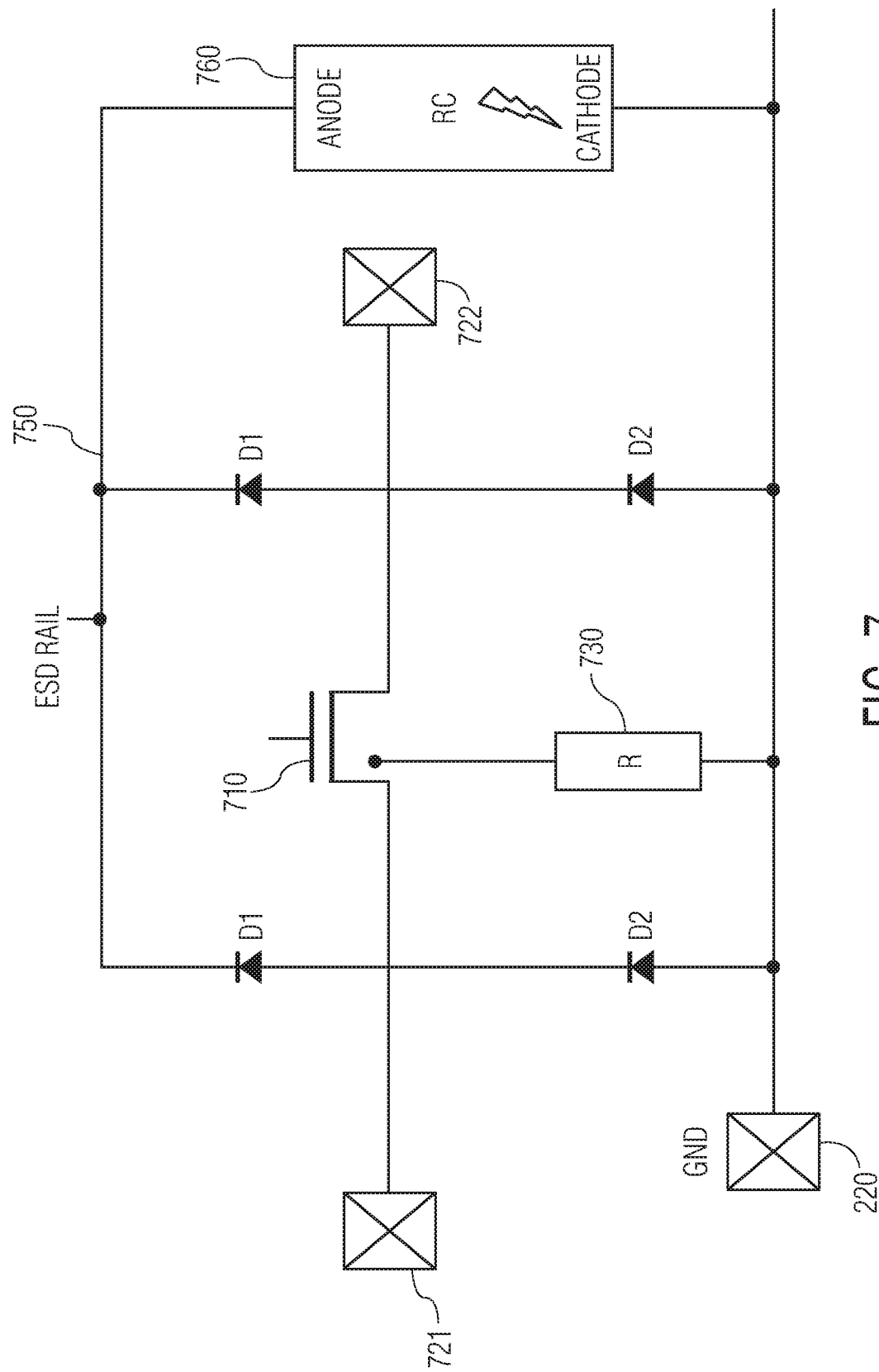
FIG. 7 illustrates another embodiment for performing electrostatic discharge protection.

FIG. 7 illustrates an equivalent circuit diagram of the ESD protection features of FIG. 6 for a USB signal path, and more particularly includes an embodiment of a switch structure for USB communications. Any asymmetry in the metal routing relative to the pad-opening, ESD diodes, clamp circuit, and USB switch block may adversely affect common mode-to-differential rejection ratio, which, in turn, may increase mismatch in capacitive coupling between the USB P/N pins.

In the embodiment of FIG. 7, the conductive lines and metal routings are symmetrically arranged relative to the USB P/N signal switch 710. The switch 710 may include, for example, an n-type MOSFET which is coupled between pins 721 and 722. Pin 721 may be a pin on the host circuit/system side and pin 722 may be a pin (e.g., USB_P) pin of the cable side. The switch 710 is also connected to a ground pin 220 through a resistor 730. The gate voltage of the transistor switch 710 may be generated by sensing the input common mode voltage, which is then level shifted to a higher voltage using a charge pump voltage. Each switch side is protected with the help of ESD diodes, and the resulting current is then discharged either through a ground plane or via floating ESD rail.

The ESD protection features include diodes D1 and D2 coupled between an ESD rail 750 and the ground pin 220. The ESD rail 750 is coupled to the anode of an electrostatic discharge diode 760. The cathode of diode 760 is coupled to the ground pin 220. When an electrostatic discharge occurs, one or both of diodes D1 and D2 are forward biased, which, in turn, forward biases diode 760 to discharge electricity to ground. As shown in FIG. 7, the diodes D1 and D2 and their associated lines are also symmetrically arranged. All of the symmetrical features of this arrangement may reduce, if not eliminate, the mismatch in capacitive coupling parasitics, which may reduce or minimize de-sense in the mobile device 20.

FIGS. 8A to 11B illustrate simulated results for one or more embodiments.

Figures 8A, 8B:
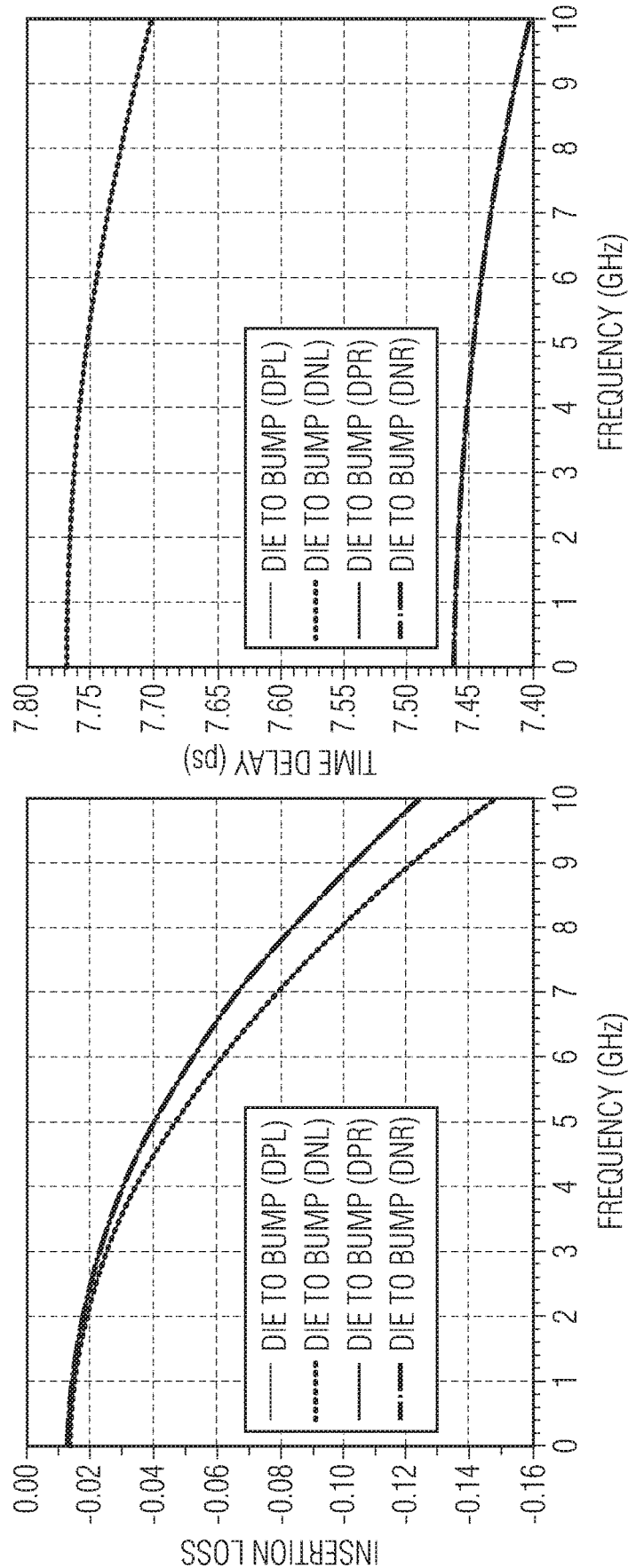
FIGS. 8A and 8B illustrate example results according to one or more embodiments.
Figure 8D:
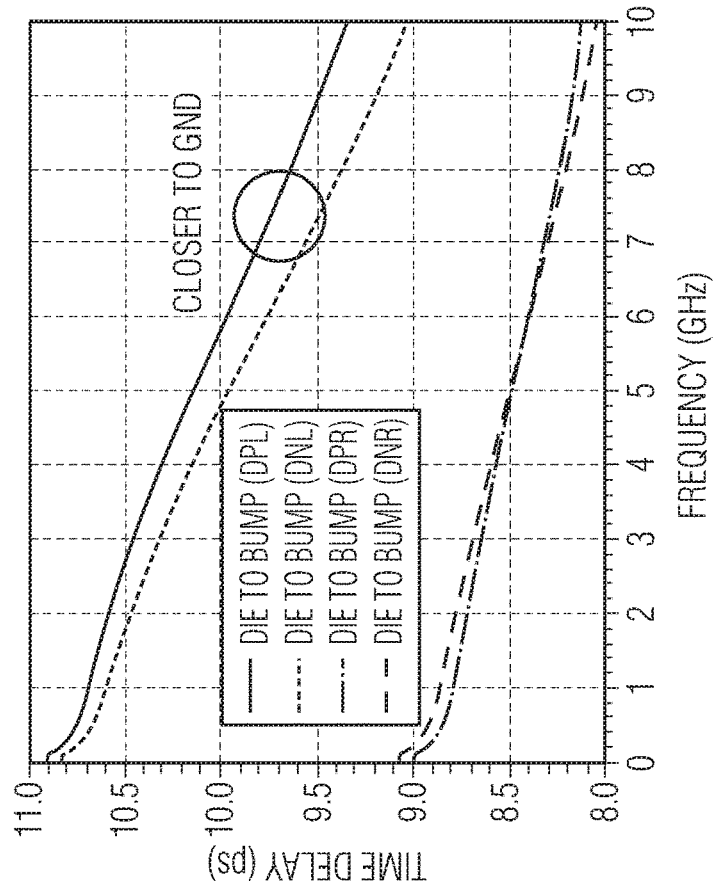
FIGS. 8C and 8D illustrate results obtained without the embodiment(s) in FIGS. 8A and 8B.
Figure 8C:
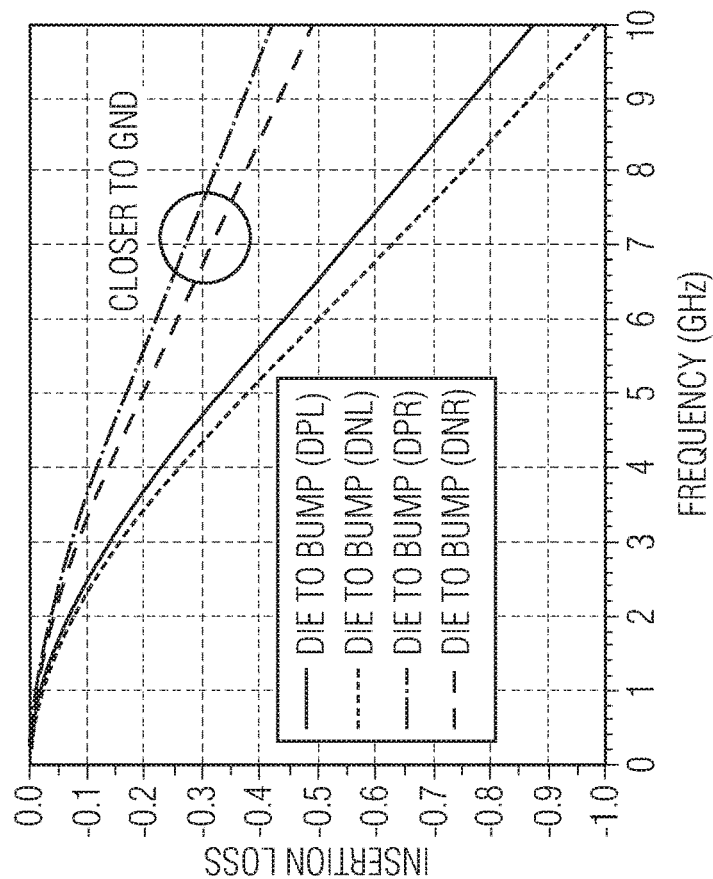

FIGS. 8A and 8B illustrate example results achieved by the filter and symmetrical arrangement of features achieved by one or more embodiments described herein. These results show the reduction of skew achieved between the P and N lines of a differential USB signal line, for example, as shown in FIG. 3 or FIG. 5. In FIG. 8A, the symmetrical pattern of ground pins of the filter produced a symmetry of the insertion loss between P & N signal pins between the die and package. Symmetry improvements are for both input and output sides of the chip. Results also show a significant reduction in the amount of insertion loss realized over a 10 GHz frequency range, compared with an arrangement which does not have the filter described herein. In FIG. 8B, the time delays associated with transmitting the USB signals was significantly lower as a result of the symmetrical ground pin arrangement. FIGS. 8C and 8D illustrate, in comparison, results obtained without the filter and symmetrical arrangement features in FIGS. 8A and 8B. The results show that skew, insertion loss, and return loss are much worse when the filter is not included in an asymmetrical arrangement. FIGS. 8C and 8D illustrate, in comparison, results obtained without the filter and symmetrical arrangement features in FIGS. 8A and 8B. The results show that skew, insertion loss, and return loss are much worse when the filter is not included in an asymmetrical arrangement.

Figure 9B:
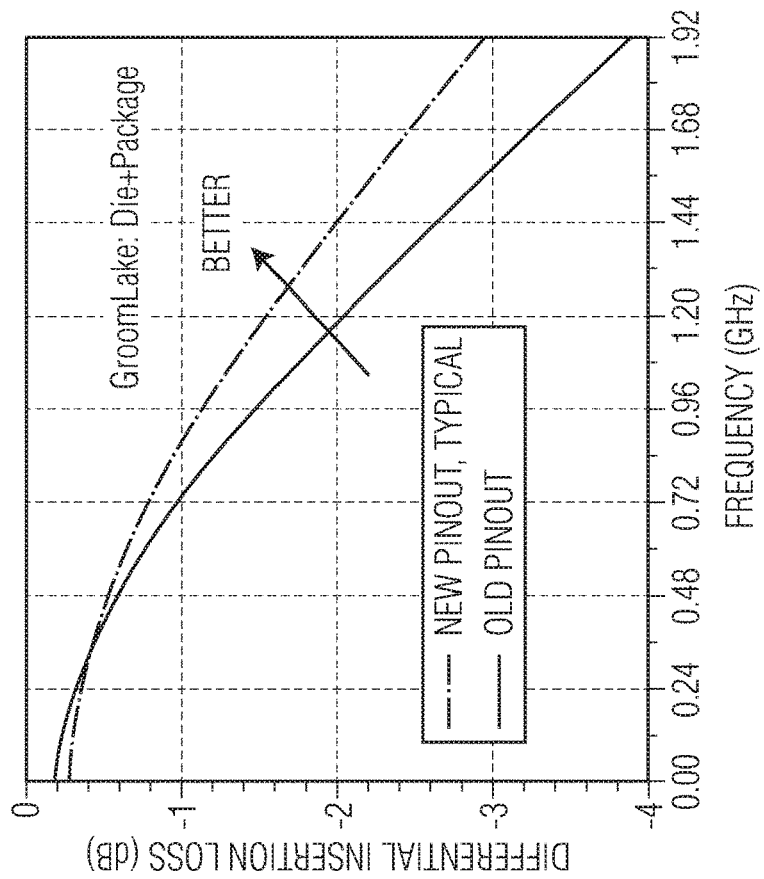
FIGS. 9A-9C illustrate example results according to one or more embodiments.
Figure 9A:
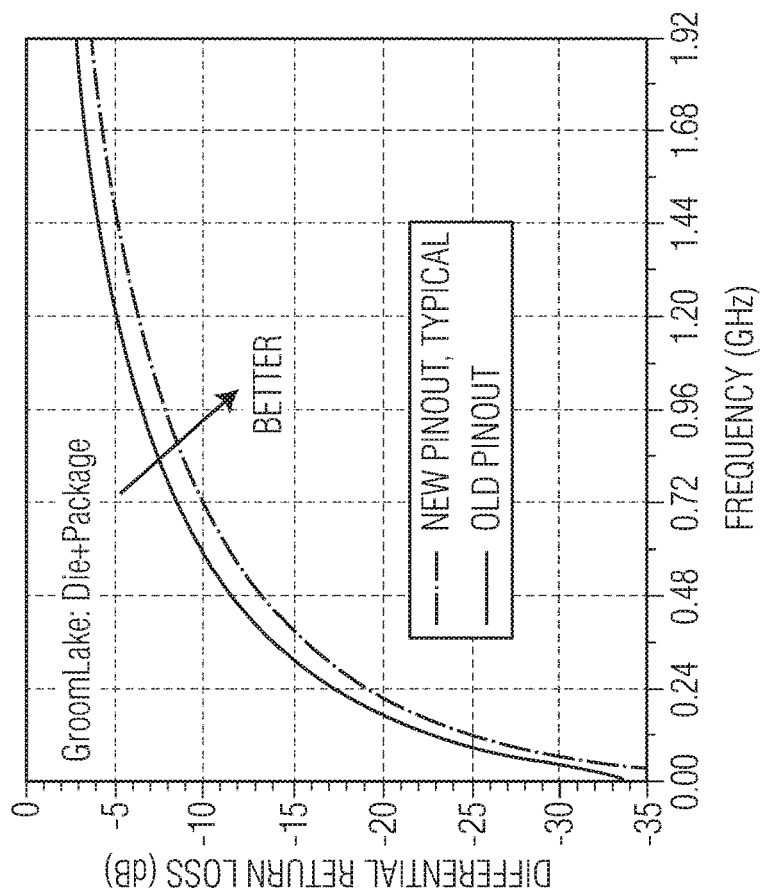
Figure 9C:
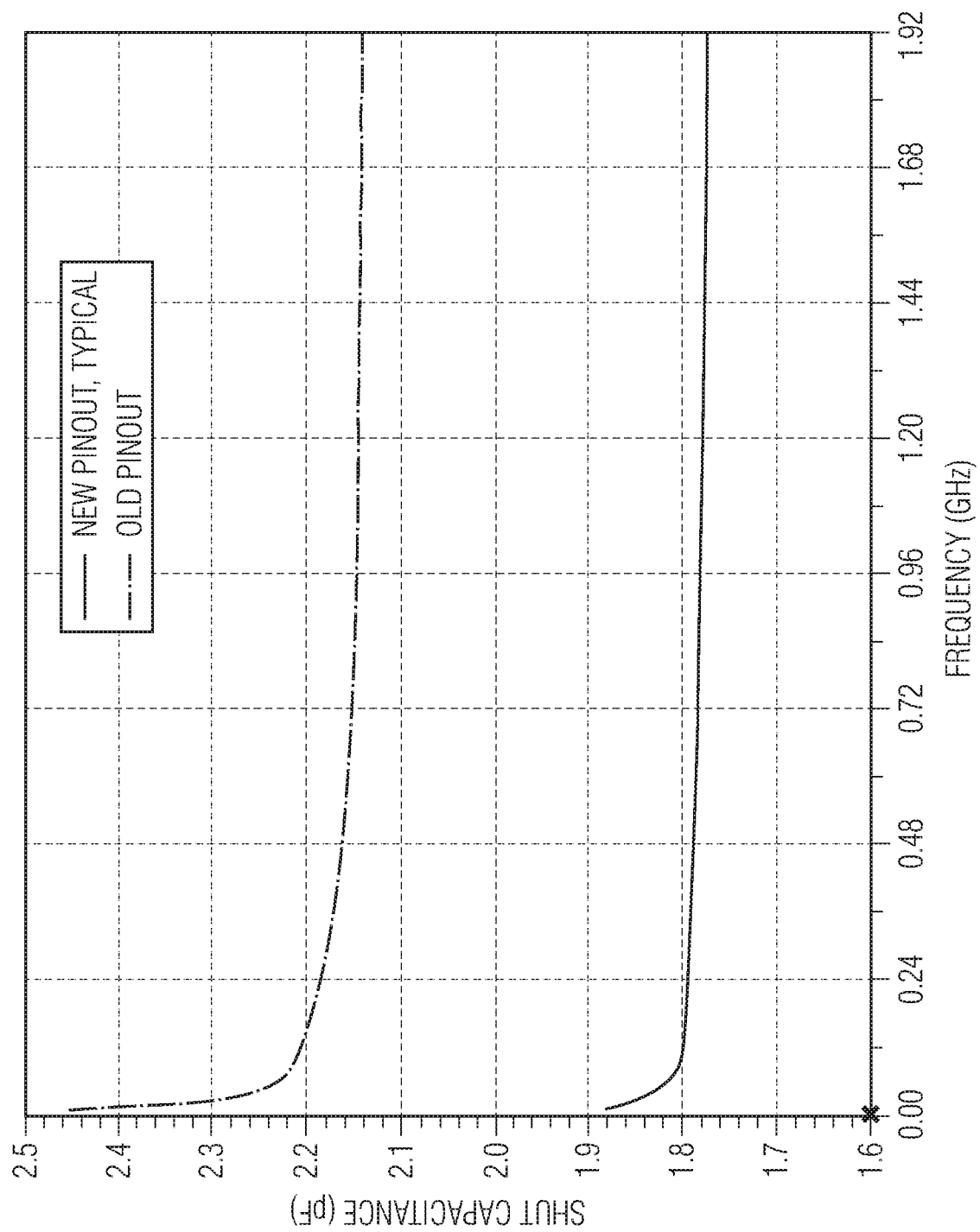

FIGS. 9A-9C illustrates example results of improved package and die performance relative to another arrangement that does not have the filter described herein. In FIG. 9A, the lower curve showed that a filter in accordance with one or more embodiments produced lower differential return loss compared with the upper curve, which represents the performance of another tested arrangement. In FIG. 9B, the upper curve showed that the filter produced an improved level of different insertion loss. In FIG. 9C, the lower curve shows that the filter produced a significant reduction in capacitive coupling between the differential signal lines, compared to the upper curve corresponding to another arrangement that omitted the filter.

Figure 10A:
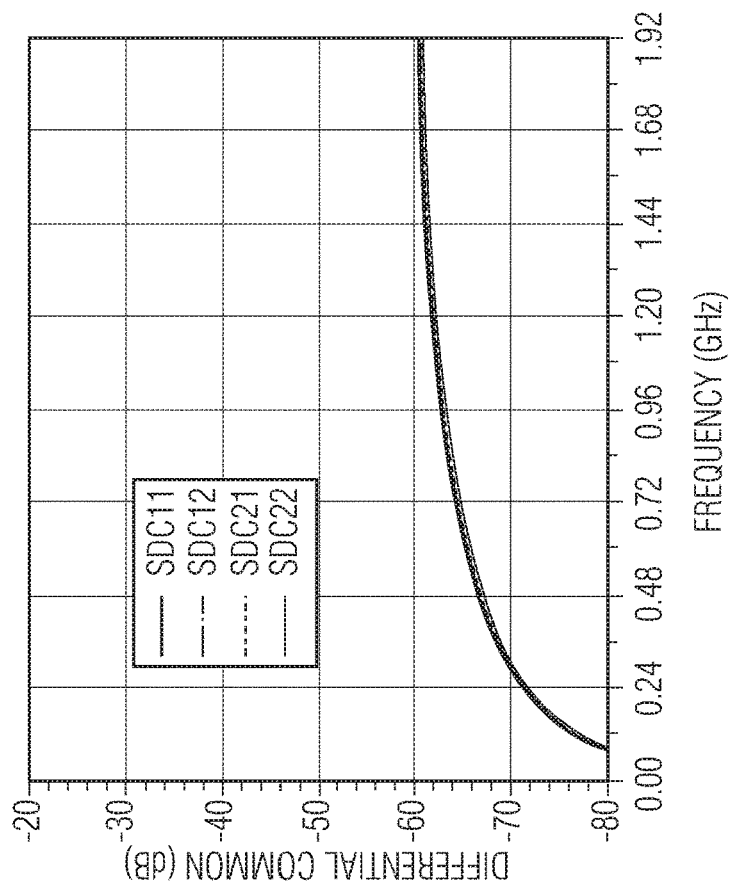
FIGS. 10A and 10B illustrate example results according to one or more embodiments.
Figure 10B:
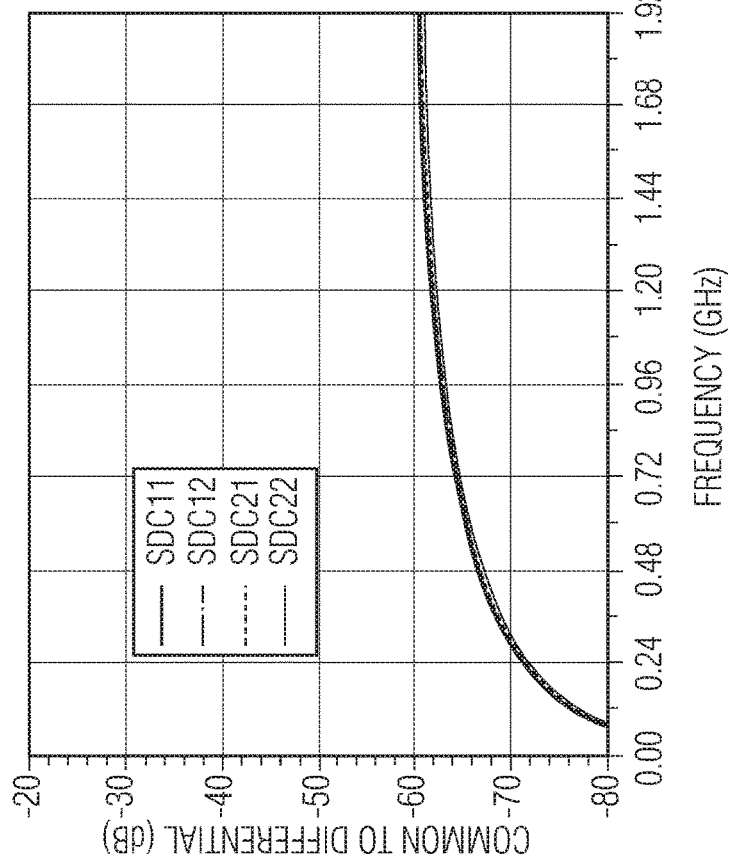

FIGS. 10A and 10B illustrate example results of the improved mixed mode conversion performance of a chip/chip package that includes the filter described herein. FIG. 10A illustrates an example of common-to-differential mixed mode results, and FIG. 10B illustrates an example of differential-to-common mixed mode results. From these results, it is apparent that EMI and de-sense would be significantly reduced as a result of the filter described herein. FIGS. 10C and 10D illustrate, in comparison, results obtained without the chip/chip package of FIGS. 10A and 10B. These results show must worse mixed mod conversion performance.

Figure 11A:
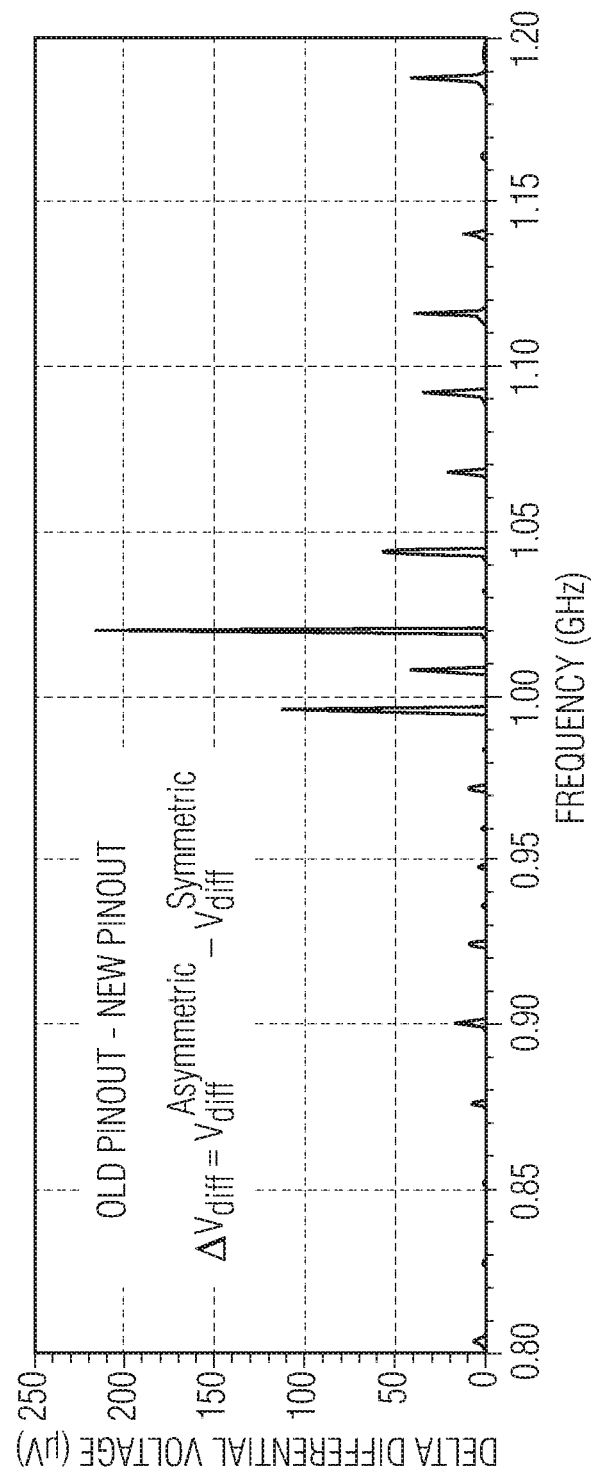
FIGS. 11A and 11B illustrate example results according to one or more embodiments.
Figure 11B:
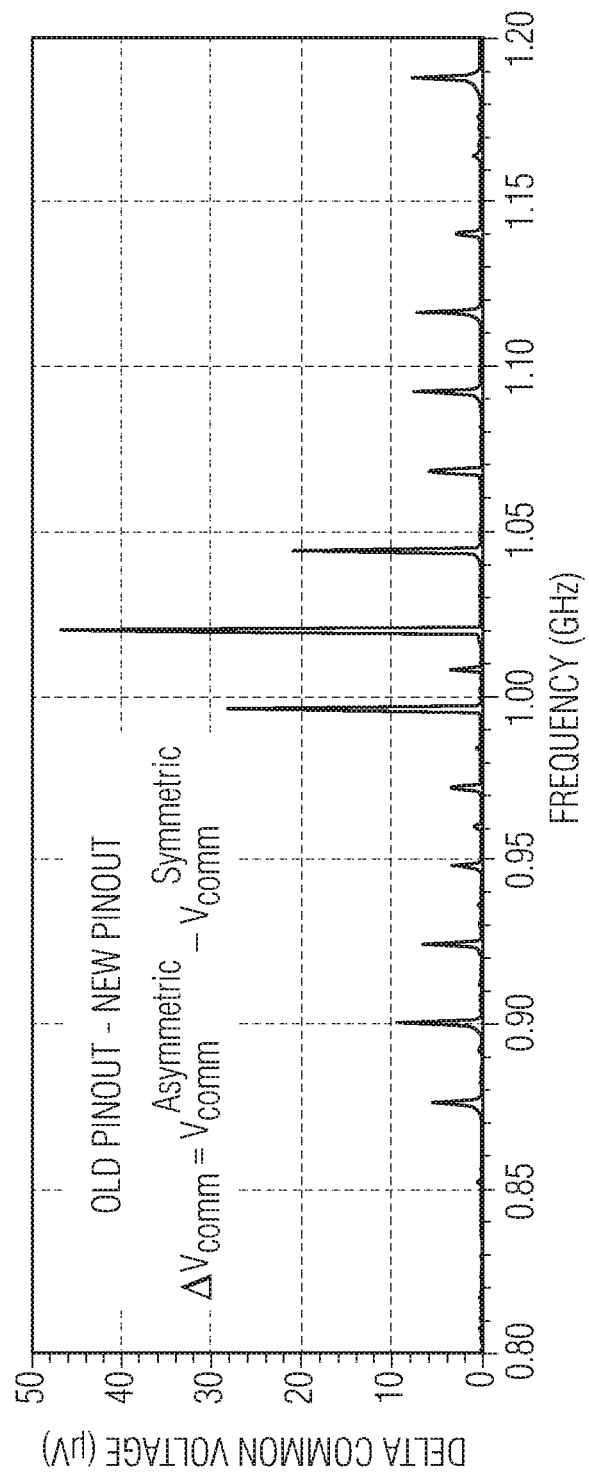

FIGS. 11A and 11B illustrate examples of a reduction in harmonic emissions achieved out to the third- and fourth-orders from a chip including a filter as described herein. Reducing these harmonics produces a proportional reduction in EMI and de-sense, which, in turn, may improve the overall performance of the mobile device. In one embodiment, the spacings, size, materials, and/or other feature of the ground conductors may be adjusted in order to tune the filter to operate in a specific frequency range and/or to suppress certain harmonics to reduce de-sense in the mobile device.

As all of the example results show, a filter in accordance with one or more embodiments described herein eliminates the need to perform EMI filtering by an external chip or device. Also, in accordance with one or more embodiments, parasitic capacitance between adjacent signal lines, pins, conductors, etc., may be reduced, return loss may be improved in a way that suppresses unwanted RF emissions produced from mismatch, insertion loss may be improved, and mixed mode conversions may be reduced or minimized.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. By way of non-limiting example, the specification speaks of a semiconductor device such as a chip, and it will be appreciated that the invention can apply to a semiconductor device that is a single chip, as well as a semiconductor device that includes multiple chips, such as a multi-chip module. Accordingly, the foregoing disclosure, description, and figures are for illustrative purposes only and do not in any way limit the invention, which is defined only by the claims.

We claim:

1. A chip package, comprising:
   at least one signal pin;
   a filter including a plurality of ground pins,
   wherein the at least one signal pin is configured to carry a signal that conforms to an interface protocol; and
   wherein the plurality of ground pins at least partially surround the at least one signal pin,
   wherein the plurality of ground pins are configured to filter electromagnetic interference generated by the signal to be carried by the at least one signal pin; and
   an electrostatic discharge circuit electrically connected to one or more of the ground pins;
   wherein the electrostatic discharge circuit includes a plurality of diodes arranged in a symmetric pattern relative to the at least one signal pin.

2. The chip package of claim 1,
   wherein the electromagnetic interference includes harmonics generated by the signal to be carried by the at least one signal pin.

3. The chip package of claim 1,
   wherein the at least one signal pin includes a first signal pin and a second signal pin and
   wherein the first and second signal pins correspond to a differential signal line of the interface protocol.

4. The chip package of claim 1,
   wherein the ground pins are arranged in a symmetrical pattern that reduces mixed mode conversion.

5. The chip package of claim 1,
   wherein the chip package is electrically connected between one or more signal lines of an interface and a plug or connector of the interface.

6. The chip package of claim 5,
   wherein the interface is a cable.

7. The chip package of claim 1,
   wherein the interface protocol is a Universal Serial Bus (USB) protocol.

8. A printed circuit board, comprising:
   a plurality of vias;
   at least one signal line;
   a plurality of ground conductors,
   wherein the plurality of ground conductors are in respective ones of the vias and at least partially surround the at least one signal line which is configured to carry a signal that conforms to an interface protocol,
   wherein the plurality of ground conductors configured to filter electromagnetic interference generated by the signal to be carried by the at least one signal line; and
   an electrostatic discharge circuit electrically connected to one or more of the ground conductors;
   wherein the electrostatic discharge circuit includes a plurality of diodes arranged in a symmetric pattern relative to the at least one signal line.

9. The printed circuit board of claim 8,
   wherein the ground conductors are arranged symmetrically relative to the at least one signal line.

10. The printed circuit board of claim 8,
    wherein the at least one signal line includes a first signal line and a second signal line and
    wherein the first and second signal lines correspond to a differential signal line.

11. The printed circuit board of claim 10, further comprising:
    a first conductive line; and
    a second conductive line adjacent to the first conductive line,
    wherein the first conductive line electrically connects a first diode to a first ground conductor of the plurality of ground conductors and
    the second conductive line electrically connects a second diode the first ground conductor or a second ground conductor of the plurality of ground conductors,
    the first and second conductive lines and the first and second diodes arranged in a symmetrical pattern between the first signal line and the second signal line.

* * * * *